US008638886B2

(12) United States Patent
He

(10) Patent No.: US 8,638,886 B2
(45) Date of Patent: Jan. 28, 2014

(54) PARALLEL VITERBI DECODER WITH END-STATE INFORMATION PASSING

(75) Inventor: Runsheng He, Sunnyvale, CA (US)

(73) Assignee: Credo Semiconductor (Hong Kong) Limited, Hong Kong (CN)

( * ) Notice: Subject to any disclaimer, the term of this patent is extended or adjusted under 35 U.S.C. 154(b) by 679 days.

(21) Appl. No.: 12/565,817

(22) Filed: Sep. 24, 2009

(65) Prior Publication Data

US 2011/0069791 A1 Mar. 24, 2011

(51) Int. Cl.
*H03M 13/03* (2006.01)
*H04L 27/06* (2006.01)

(52) U.S. Cl.
USPC ........... 375/341; 375/265; 375/262; 326/105; 714/795; 714/794; 712/212

(58) Field of Classification Search
USPC ......... 375/316, 324, 340, 341, 295, 310, 265, 375/262, 240.26–240.27, 219, 222; 714/795, 794, 976, 798, 799, 786, 792, 714/763, 764, 772; 712/1, 2, 10, 11, 16, 35, 712/212, 220, 231; 326/105
See application file for complete search history.

(56) References Cited

U.S. PATENT DOCUMENTS

| | | | |
|---|---|---|---|
| 5,420,587 A | 5/1995 | Michel | |
| 5,936,566 A | 8/1999 | Park | |
| 6,002,356 A | 12/1999 | Cooper | |
| 7,505,695 B2 | 3/2009 | Sugihara et al. | |
| 7,574,146 B2 | 8/2009 | Chiang et al. | |
| 7,933,341 B2 * | 4/2011 | Agazzi et al. | 375/260 |
| 2002/0007474 A1 * | 1/2002 | Fujita et al. | 714/755 |
| 2003/0123579 A1 | 7/2003 | Safavi et al. | |
| 2005/0190868 A1 * | 9/2005 | Khandekar et al. | 375/346 |
| 2007/0067704 A1 * | 3/2007 | Altintas et al. | 714/795 |
| 2008/0253438 A1 * | 10/2008 | Riani et al. | 375/232 |
| 2010/0098042 A1 * | 4/2010 | Dent | 370/342 |
| 2011/0116806 A1 | 5/2011 | He | |
| 2012/0207247 A1 | 8/2012 | Cheng | |

OTHER PUBLICATIONS

Black, Peter J., et al., "A 1-Gb/s, Four-State, Sliding Block Viterbi Decoder", *IEEE Journal of Solid-State Circuits*, vol. 32, No. 6, (Jun. 1997), pp. 797-805.

(Continued)

*Primary Examiner* — Sam K Ahn
*Assistant Examiner* — Linda Wong
(74) *Attorney, Agent, or Firm* — Krueger Iselin LLP

(57) ABSTRACT

A parallel implementation of the Viterbi decoder becomes more efficient when it employs end-state information passing as disclosed herein. The improved efficiency enables the usage of less area and/or provides the capacity to handle higher data rates within a given heat budget. In at least some embodiments, a decoder chip employs multiple decoders that operate in parallel on a stream of overlapping data blocks, using add-compare-select operations, to obtain a sequence of state metrics representing a most likely path to each state. Each decoder passes information indicative of a selected end-state for a decoder operating on a preceding data block. Each decoder in turn receives, from a decoder operating on a subsequent data block, the information indicative of the selected end-state. The end-state information eliminates any need for post-data processing, thereby abbreviating the decoding process.

18 Claims, 4 Drawing Sheets

(56) References Cited

OTHER PUBLICATIONS

Cheng, Lawrence Chi Fung "A High-Speed Flash Analog to Digital Converter", U.S. Appl. No. 13/027,625, filed Feb. 15, 2011, titled "A High-Speed Flash Analog to Digital Converter" 16 pgs.

Greshishchev, Yuriy M., et al., "A 40GS/s 6b ADC in 65nm CMOS", ISSCC 2010/Session 21/Successive-Approximation ADCs/21.7, 2010 IEEE International Solid-State Circuits Conference, pp. 390-392.

Qian, Haoli et al., "High-Speed Parallel Decision Feedback Equalizer", U.S. Appl. No. 13/594,595, filed Aug. 24, 2012, titled "High-Speed Parallel Decision Feedback Equalizer", 13 pgs.

US Non-Final Office Action, dated Sep. 11, 2012, U.S. Appl. No. 13/027,625, "High-Speed Flash Analog to Digital Converter", filed Feb. 15, 2011, 8 pgs.

US Notice of Allowability, dated Jun. 26, 2012, U.S. Appl. No. 12/618,735, "High-Speed Adaptive Decision Feedback Equalizer", filed Nov. 15, 2009, 4 pgs.

* cited by examiner

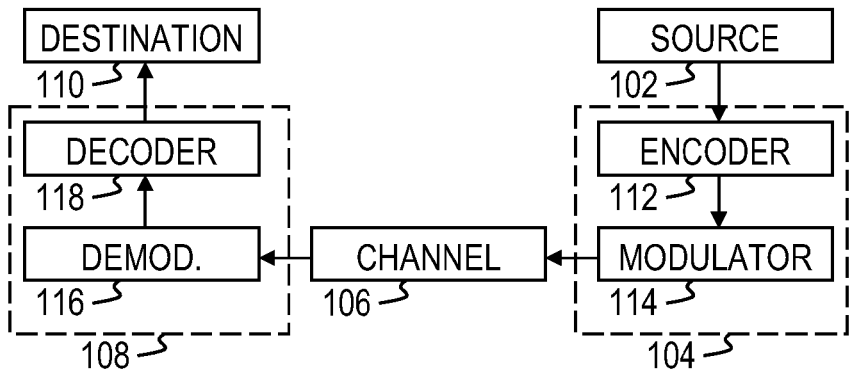
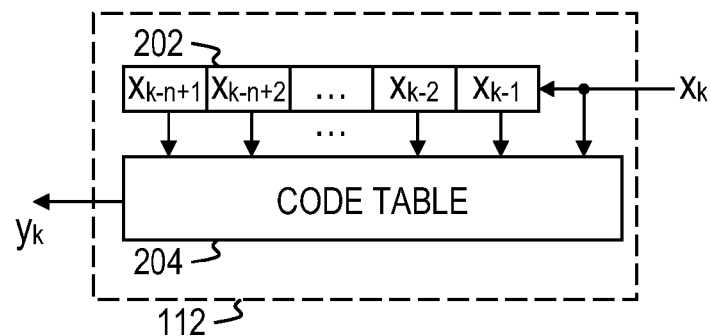
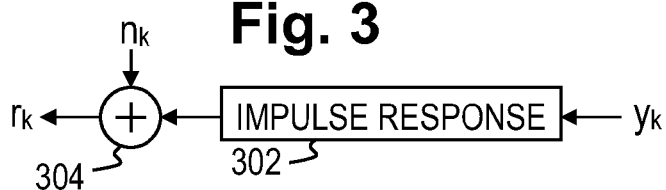

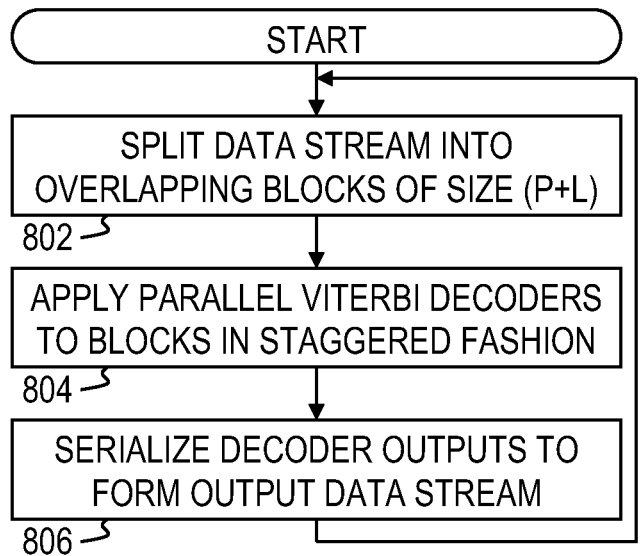
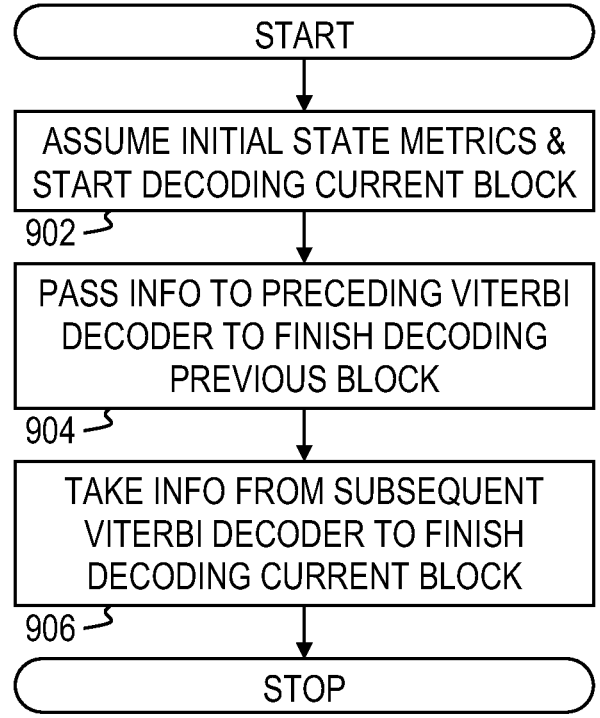

US 8,638,886 B2

PARALLEL VITERBI DECODER WITH END-STATE INFORMATION PASSING

BACKGROUND

The Viterbi algorithm has found wide application in the digital communications field, having been used in applications as diverse as satellite communications, hard disk drives, cell phones, wireless personal area networks, and optical fiber channels. In addition to being used for channel equalization, it is an important component for many error-correction coding schemes in the convolutional coding family including trellis codes and turbo codes. Such codes are employed, for example, in the so-called second and third generation (2G/3G) communication standards IS-95, CDMA2000, WCDMA and TD-SCDMA.

Though popular, the Viterbi algorithm in its purest form suffers from various shortcomings. Over the years, many variations of the Viterbi algorithm have been developed to address these deficiencies. Among the variations that have been developed are parallel "sliding block" Viterbi algorithms. (See, e.g., Peter J. Black, Teresa H. Y. Meng, "A 1-Gb/s, Four-State, Sliding Block Viterbi Decoder", IEEE J Solid-State Cir., vol. 32, no. 6, June 1997.) Designed to address the inherently sequential nature of the original Viterbi algorithm, the parallel Viterbi algorithms are applied to "blocks" of the incoming data stream, augmented by pre- and post-data segments to minimize the effects of the block edges. These additional segments reduce the efficiency of the parallel Viterbi algorithm relative to the original algorithm, but this has widely been considered as the necessary price to pay to achieve parallelization.

As new standards are developed, data rates continue to increase. For example, the IEEE long-reach multi-mode fiber standard IEEE 802.3aq (sometimes referred to as 10 GBASE-LRM) provides for a channel bit rate greater than 10 Gbit/s. With currently available semiconductor technologies, a sequential Viterbi decoder is simply not feasible for such bit rates. Existing sliding block parallel Viterbi decoders either consume an undesirable amount of chip area or require unduly elevated clock rates. These shortcomings are at least partly addressed by the systems and methods disclosed herein.

BRIEF DESCRIPTION OF THE DRAWINGS

A better understanding of the various disclosed system and method embodiments can be obtained when the following detailed description is considered in conjunction with the following drawings, in which:

FIG. 1 is a block diagram of an illustrative digital communications or information storage system;

FIG. 2 is a block diagram of an illustrative encoder;

FIG. 3 is an illustrative channel model;

FIG. 9 is an illustrative parallel decoding method; and

FIG. 10 is an illustrative method implementable by an individual Viterbi decoder.

Figure 4:
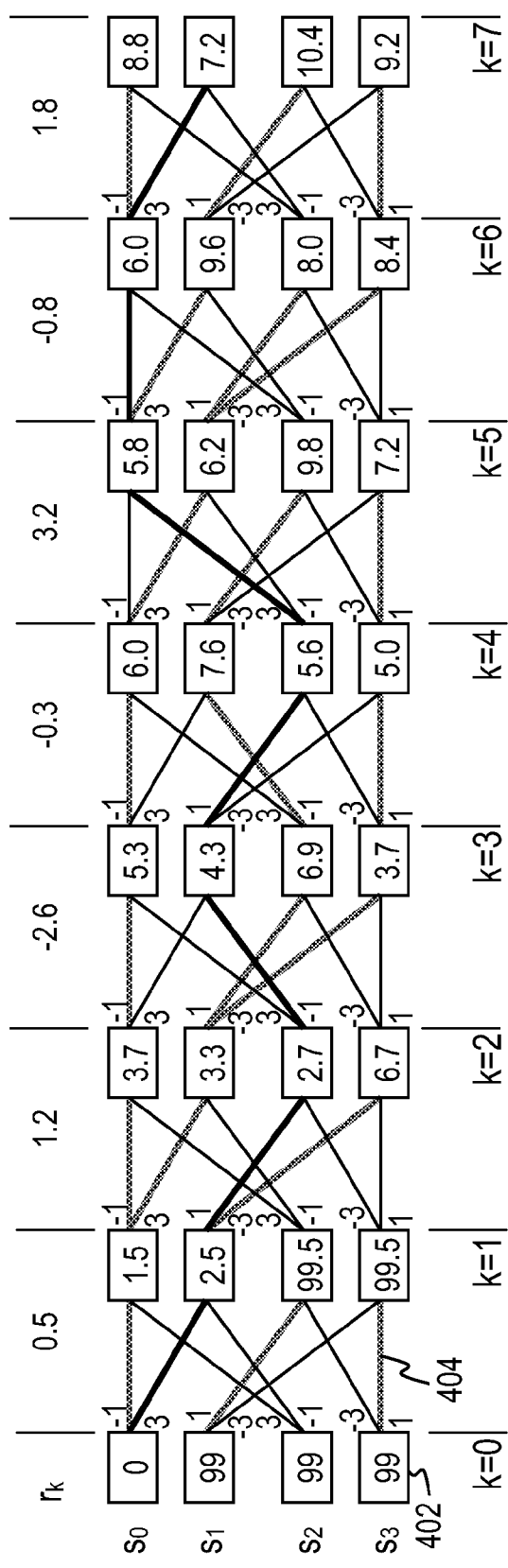
FIG. 4 shows a trellis diagram of an illustrative four-state Viterbi decoder.

While the invention is susceptible to various modifications and alternative forms, specific embodiments thereof are shown by way of example in the drawings and will herein be described in detail. It should be understood, however, that the drawings and detailed description thereto are not intended to limit the disclosure to the illustrated embodiments. To the contrary, the intention is to cover all modifications, equivalents and alternatives falling within the scope of the appended claims.

DETAILED DESCRIPTION

The parallel Viterbi decoders disclosed herein employ end-state information passing to increase their efficiency. The improved efficiency enables the usage of less area and/or provides a capacity for handling higher data rates within a given heat budget. In at least some embodiments, a decoder chip employs multiple decoders that operate in parallel on a stream of overlapping data blocks using add-compare-select operations to obtain a sequence of state metrics representing a most likely path to each state. Each decoder passes information indicative of a selected end-state for a decoder operating on a preceding block. Each decoder in turn receives, from a decoder operating on a subsequent block, the information indicative of the selected end-state. The end-state information eliminates a need for post-data processing, thereby abbreviating the decoding process.

The invention is best understood in context. Accordingly, FIG. 1 shows an illustrative system for digital communications or digital information storage. A transmitter 104 processes data from a data source 102 and makes it available as a signal to a receiver 108 via a channel 106. The receiver 108 detects the signal and extracts the data for destination 110. Transmitter 104 optionally includes an encoder 112 to add error protection to the data stream. A modulator 114 converts the encoded data stream into a form suitable for channel 106. Conversely, receiver 108 includes a demodulator 116 to translate the received signal into digital form, and an optional decoder 118 to extract the original data stream from the received data stream.

The system of FIG. 1 is kept fairly generic in order to represent a wide variety of systems to which the present disclosure can be applied. Channel 106 can be or include, for example and without limitation, a wireless (electromagnetic wave) connection, an optical fiber, a transmission line, an acoustic waveguide, or even a flow of mass. Channel 106 can also be or include an information storage medium such as, for example, a magnetic tape, an optical disk, a charge-coupled array, or even a printed page. When any of these examples is employed at a sufficiently high rate or storage density, the channel symbols are subject to distortion, interference, and/or noise. To combat these effects, system designers employ equalization and/or error correction coding (ECC).

FIG. 2 shows an illustrative error correction encoder 112, which derives a sequence of encoded data symbols $y_k$ from a sequence of source data symbols $x_k$ (the encoded data symbols generally come from a set that is larger than the set of source data symbols). Encoder 112 includes a shift register 202 and an encoding mechanism 204. In FIG. 2, the encoding mechanism 204 is generically represented as a code look-up table, but any number of suitable encoding mechanisms exist. The shift register 202 represents a memory of the encoder. Because each output code symbol $y_k$ depends on the current input symbol $x_k$ and the n−1 preceding input symbols, the "memory" of the code is n−1 symbols. Put in another way, the output code symbol $y_k$ depends on the current input symbol $x_k$ and a state of the encoder 112 as determined by the contents of the shift register 202.

FIG. 3 shows a illustrative channel model which represents the combined effects of modulator 114, the channel 106, and demodulator 116. It is noted that the terms "modulator" and "demodulator" are often used loosely in the industry. Herein these terms are specifically employed to represent the conversion between the analog signal domain and the digital domain. The channel model convolves the encoded data symbols $y_k$ with an impulse response 302, and an adder 304 adds an error signal $n_k$ to produce received signal symbols $r_k$. The effect of the impulse response 302 is remarkably similar to the effect of the encoder 112 in that the output of the channel model is based on the current data symbol $y_k$ and the channel state which is determined by the preceding channel inputs.

The Viterbi algorithm is based on the principle that a memory of a channel or an encoder is finite, so future signals are independent of anything that predates the memory. Thus at any given time the various paths to each state can be compared, and a decision can be made for each possible state without further delay. Once decisions have been made at each time step for each state, a Viterbi decoder can then complete the decoding process by comparing the states at an end of a sequence.

There are various ways of reducing the Viterbi algorithm to practice in a channel decoder or ECC decoder, but the principles are best understood by way of example. FIG. 4 shows a trellis diagram of an illustrative four-state Viterbi decoder. The states 402 at each given step (k=0, 1, 2, . . . ) correspond to the possible encoder states $S_0$-$S_3$. The transitions 404 between the states correspond to the possible input symbols $x_k$ (and the corresponding output symbols $y_k$). Thus, for example, the four states in FIG. 4 correspond to the states of a 2-bit shift register: 00, 01, 10, and 11. An input symbol of $x_k$=0 causes a transition from 00 to 00, from 01 to 10, from 10 to 00, and 11 to 10. The corresponding output symbols $y_k$ vary depending on the state, and are shown as transition labels in the diagram. An input symbol of $x_k$=1 causes a transition from 00 to 01, from 01, to 11, from 10 to 01, and from 11 to 11. The structure repeats at each time step. More complex encoders offer more states and more possible transitions between states.

For each state at each time interval, the decoder determines a path metric, i.e., a measure of the quality of the best path to that state. Typically the path metric is a Euclidean distance measurement, though this is not a requirement. The decoder further records the best path to each state (a so-called "register passing" implementation), or provides a marker to enable later determination of the best path to each state (a so-called "trace-back" implementation). Starting from an initial state, the decoder carries out a series of "add-compare-select", or ACS, operations.

The initial state is often set arbitrarily, e.g., with zero metrics for each state. However, if the initial encoder state is known (e.g., if it always states with state $S_0$), the metric for the corresponding decoder is set much smaller than the metrics for the other states. In FIG. 4, the initial metrics for the four states $S_0$-$S_3$ are 0, 99, 99, and 99, respectively.

A top row of FIG. 4 shows a sequence of receive signal values $r_k$. As each receive signal value is received, it is compared to each possible receive symbol by finding a magnitude of a difference between the receive symbol value and the possible receive symbol value. The decoder of FIG. 4 allows for receive symbol values of −3, −1, 1, and 3. At step k=1, a receive signal value of 0.5 creates difference magnitudes of 3.5, 1.5, 0.5, and 2.5, respectively.

For each state at k=1, the difference magnitudes associated with the incoming transitions are added to the respective path metrics from the preceding state, and compared to select the smaller one. In FIG. 4, the first of two transitions to state $S_0$ at k=1 has a difference magnitude of 1.5. The difference magnitude of 1.5 is added to the previous state metric of 0 for a total of 1.5. The second of the two transitions has a difference magnitude of 2.5, added to the previous state metric of 99 for a total of 101.5. The smaller value (1.5) is selected, and in FIG. 4 this is shown by drawing the first transition as a thicker line. Implementation-wise, this marking can be done by setting a register bit to an appropriate value.

This process is repeated for each state at step k=1, and for each state at each step thereafter, resulting in the sequence of state metrics that are shown in FIG. 4 at k=7. Each state has the metric for one selected or "surviving" path. After the decoder has completed the ACS steps for each value in the received signal sequence, the decoder then identifies the ending state having the smallest metric, which indicates the best surviving path through the trellis. The best path can then be determined by tracing back along the selected transitions. In FIG. 4, the best path is shown by the thicker solid black lines.

The foregoing rudimentary explanation of the Viterbi decoder is sufficient background to highlight the issue of convergence. It is generally possible to begin decoding the input symbols $x_k$ long before the decoder reaches the end of the receive signal sequence because well designed codes ensure that all of the surviving paths converge within some number of steps back into the trellis. Most codes ensure a statistical convergence within 5m steps, wherein m is the length of the encoder's shift register. Any input symbol decisions that occur within this window are suspect, whereas decisions made outside this window are nearly as reliable those that would be obtained from an optimal decoder.

For the sake of a more specific discussion, the ensuing description will focus on a 10 GBASE-LRM (IEEE 802.3aq) optical fiber channel with the understanding that the disclosed methods and devices are readily adaptable to other applications. The IEEE standard 802.3aq is suited for Ethernet communications between computers via network switches and routers, and in this application the transmitter 104 and receiver 108 of FIG. 1 are portions of optical transceiver modules. Typically each switch or router includes many such modules, each of which includes a transmitter and a receiver for converting between electrical signals and optical signals for point-to-point communications with a corresponding module at the other end of the optical fiber. Commercially available form factors include XENPAK, X2, XPAK, XFP, and SFP.

Optical transceiver modules typically do not include ECC encoders 112 (see FIG. 1). However, modal dispersion in the optical fiber causes inter-symbol interference (ISI), making it desirable for a Viterbi decoder 116 to compensate for channel effects. The transceiver modules are typically implemented as integrated circuits formed on semiconductor substrates. Physical limits of current semiconductor processing technology make it infeasible to perform Viterbi decoder ACS operations at rates in excess of 3 GHz. Accordingly, the Viterbi decoder is parallelized.

Figure 5:
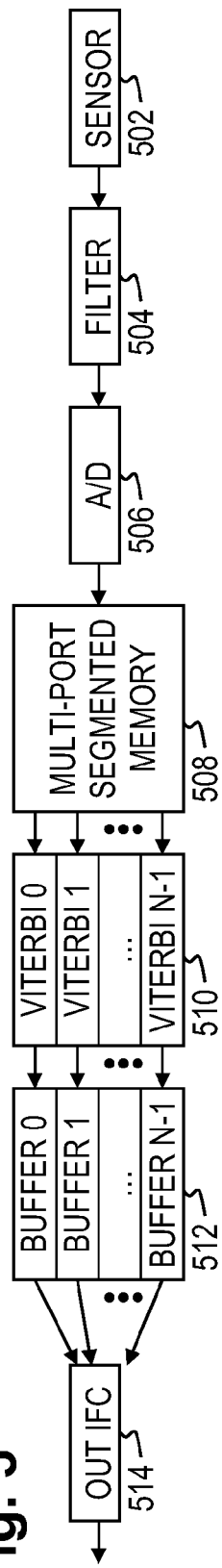
FIG. 5 is a block diagram of an illustrative receiver.

FIG. 5 shows a block diagram of a receiver portion of an illustrative optical transceiver module. The receiver of FIG. 5 may be, for example, one embodiment of the receiver 108 of FIG. 1. A sensor 502 derives an electrical signal from the optical pulses conveyed by the channel 106 (see FIG. 1). A filter 504 limits the bandwidth of the receive signal before it is digitized by analog-to-digital (ND) converter 506. The ND converter 506 feeds a high-rate digital signal stream into a multi-port memory 508, which in turn makes the data available in the form of N parallel streams of data blocks as described further below. A set of N Viterbi decoders 510 operates on the data blocks as they become available, each data block being decoded by a given Viterbi decoder. A corresponding set of N data buffers 512 stores the decoded data until it can be retrieved by an output interface 514, which sequences the data to form a decoded data stream for output to a data destination.

Figure 6:
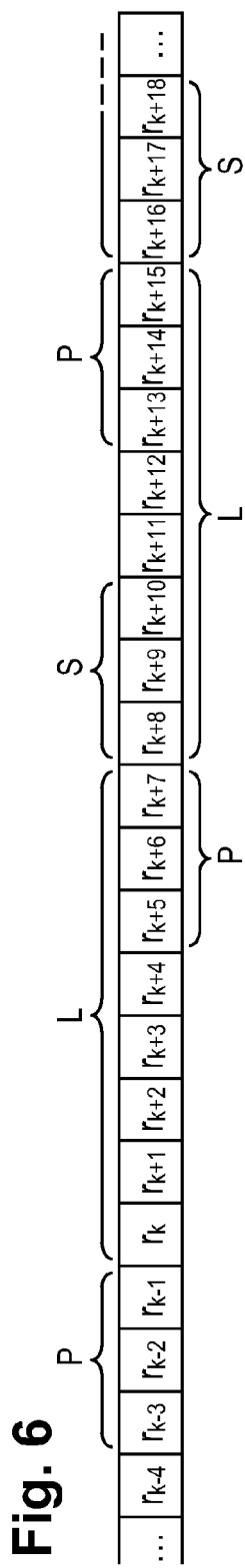
FIG. 6 shows an illustrative division of a data stream into overlapping data blocks.

FIG. 6 shows an illustrative high-rate digital signal stream of receive symbols $r_k$ provided by ND converter 506 of FIG. 5. In some embodiments, the receive symbols $r_k$ are multi-bit words (e.g., amplitude values with 4-bit resolution), whereas in other embodiments (e.g., for ECC decoding) the receive symbols $r_k$ are single bits. Each of multiple Viterbi decoders (e.g., the N Viterbi decoders 510 of FIG. 5) will decode a principal data block of L symbols. Conventionally, each principal block is provided with a preamble block of P symbols and a post-data block of S symbols to assure that the Viterbi decoder's survivor paths have converged at all points within the L-symbol principal data block. In most cases P=5m and S=5m, where m is the memory of the channel or the ECC code. However, P and S may depend on the specific characteristics of the channel or ECC code, and can be adjusted to trade off between reliability and complexity. Because the decoder decisions within the preamble and post-data blocks are not reliable, these portions of the overall data block overlap with other data blocks.

Figure 7:
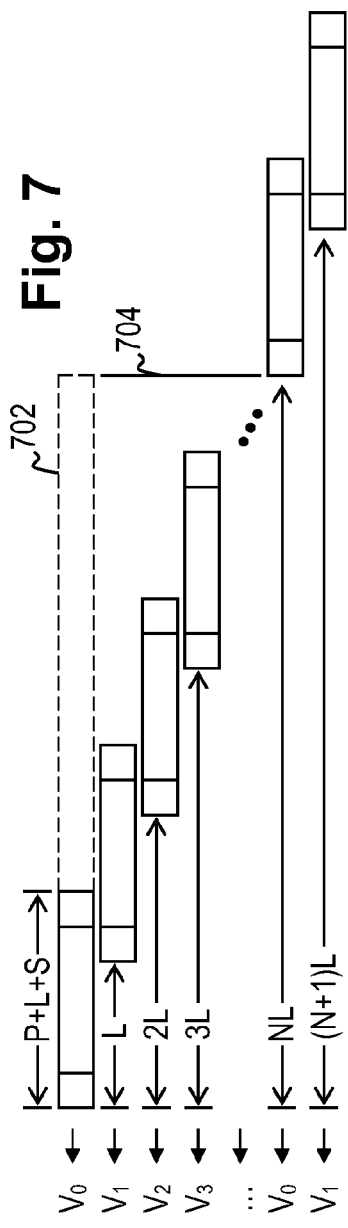
FIG. 7 shows processing of data blocks in a conventional sliding block decoding method.

FIG. 7 illustrates a processing timeline for data blocks in a conventional sliding block decoding method. The high-rate data stream is divided into overlapping data blocks of length P+L+S, which are distributed in a rotating fashion to Viterbi decoders $V_0$-$V_{N-1}$. The decoders start processing each of the overlapping data blocks as the data blocks are made available, and each decoder completes its processing before it receives a new data block. Thus in FIG. 7, Viterbi decoder $V_0$ has a processing interval 702 before it transitions to the processing of a new data block at time 704. Expressed in terms of the symbol rate of the digitized receive signal, this requirement implies that each decoder processes (P+L+S) symbols every NL symbol periods, enabling the individual decoders to operate at a reduced clock rate relative to the incoming data stream.

The P and S values for a 10 GBASE-LRM optical fiber channel are anticipated to be about 20 symbols. L has a value chosen to tradeoff between complexity and efficiency. In at least some contemplated embodiments, L ranges between 80 and 100 symbols. Each individual decoder operates at an efficiency of:

$$E=L/(P+L+S) \quad (1)$$

Assuming L has a value of 80 symbols, the decoder would have an efficiency of 0.67. The clock rate required for the decoders $R_D$ is a function of efficiency:

$$R_D=R_R/(N*E) \quad (2)$$

where $R_R$ is the digitized receive symbol rate, N is the number of parallel decoders, and E is the efficiency. Assuming a 10 GHz receive symbol rate and an efficiency of 0.67, N has to be greater than or equal to 6 to achieve an individual decoder clock rate below 2.5 GHz.

Because the decoders each start processing data blocks as they become available, each of the decoders has completed a different fraction of its assigned data block at any given time. The offset between adjacent decoders can be calculated as:

$$F=(P+L+S)/N \quad (3)$$

If P=S=20, L=80, and N=6, the offset is F=20. Thus, for example, when a decoder $V_i$ finishes one data block and starts on the next, the preceding decoder $V_{i-1}$ has finished processing 20 symbols of its data block, and the subsequent decoder $V_{i+1}$ is 20 symbols from completing its data block.

Significantly, the data block that any given decoder (i.e., a current decoder) is processing overlaps with the data block that the subsequent decoder is processing. Moreover, the subsequent decoder has finished processing the overlap by the time that the current decoder reaches it. This situation creates an opportunity to save processing by passing information from the subsequent decoder to the current decoder.

Note that if the high-rate data stream of FIG. 6 had not been parallelized, the sequential Viterbi decoder states at the end of a principal L-symbol data block would be the decoder states for the beginning of the subsequent principal data block. The path of the most likely decode sequence necessarily passes through only one state. Recall that the purpose of the post-data block is to ensure convergence of survivor paths so that a reliable decode decisions are available within the principal data block. If adjacent parallel Viterbi decoders cooperate to enforce state-matching, the post-data block can be eliminated (i.e., S=0). Once an individual one of the parallel Viterbi decoders progresses beyond the beginning of the data block far enough to assure survivor path convergence at the beginning of the principal data block (e.g., 2P symbols from the beginning of the overall data block), it can identify the appropriate end-state for the preceding data block. From the point of view of the preceding decoder, this information can be made available as early as 2P+F symbols into its data block, but in any event is required before the end of the data block (at P+L symbols). Upon reaching the end of a data block, a Viterbi decoder using the trace-back technique performs its decoding process by tracing back from the end state specified by the subsequent decoder. A Viterbi decoder using the register-exchange technique simply identifies the register associated with the selected end state and extracts the decoded data from there.

Figure 8:
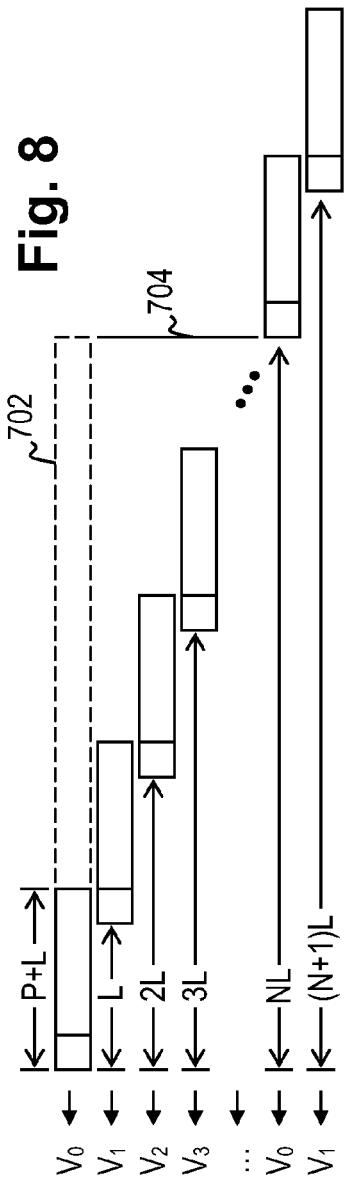
FIG. 8 shows processing of data blocks for a parallel Viterbi decoder with end-state information passing.

FIG. 8 illustrates a processing timeline for data blocks in a sliding block decoder that employs end-state information passing. The end-state passing enables the post-data block to be eliminated (i.e., S=0), thereby improving efficiency and enabling a reduction of the required number of parallel decoders. Each Viterbi decoder processes (P+L) symbols in processing interval 702 of length (N*L), starting a new data block at time 704. With P=20, S=0, L=80, and N=5, the offset F is still 20 symbols, meaning that the subsequent Viterbi decoder has decoded 80% of its data block as the given Viterbi decoder reaches the end of its data block.

FIG. 9 is an illustrative parallel decoding method that can be employed by a receiver (e.g., the receiver 108 of FIG. 1). Though the operations are shown sequentially, it should be noted that they can be performed concurrently by components of a receiving pipeline. In block 802, the receiver splits the incoming data stream into overlapping data blocks, where each data block includes a principal data block of L symbols, and a preamble of P symbols. The preamble of P symbols overlaps a portion of a preceding principal data block (see FIG. 8). In some embodiments, the data blocks overlap by at least three times the memory of a convolutional code. In block 804, the receiver distributes the data blocks in a staggered fashion to a set of Viterbi encoders operating in parallel (i.e., a set of parallel Viterbi decoders). In block 806, the output of the parallel Viterbi decoders is serialized or assembled to form a stream of decoded data.

FIG. 10 is an illustrative method implementable by an individual Viterbi decoder in the set of parallel Viterbi decoders employed in block 804 of FIG. 9. Starting in block 902, the decoder initializes its starting state metrics, e.g., to zero, and applies a series of add-compare-select operations to determine a series of state metrics and selected transitions. Once the processing has progressed far enough for the decoder to reliably ascertain the end-state of the preceding data block (e.g., 2P symbols into the current data block), the decoder passes end-state information, indicative of the end-state, to the decoder operating on the preceding data block as indicated in block 904. The decoder continues its add-compare-select operations until it reaches the end of the current data block. In block 906, the decoder receives the end-state information from the decoder operating on the subsequent data block, and uses the end-state information to complete the decoding process for the current data block.

Numerous variations and modifications will become apparent to those skilled in the art once the above disclosure is fully appreciated. It is intended that the following claims be interpreted to embrace all such variations and modifications.

What is claimed is:

1. A high-speed decoding method that comprises:
applying each of multiple Viterbi decoders in a staggered rotation to decode a sequence of overlapping data blocks from an input data stream,
passing termination information from one of the multiple Viterbi decoders to another one of the multiple Viterbi decoders operating on a preceding data block after each Viterbi decoder progresses beyond an overlapping region,
said termination information specifying a terminal state for the decoder receiving the information, and
receiving termination information at the one of the multiple Viterbi decoders from another one of the multiple Viterbi decoders operating on a subsequent data block as each Viterbi decoder reaches an end of a data block.

2. The method of claim 1, further comprising: combining outputs of the multiple Viterbi decoders to form a decoded data stream.

3. The method of claim 1, wherein the multiple Viterbi decoders decode a convolutional code.

4. The method of claim 3, wherein the overlapping data blocks overlap by at least three times a memory of the convolutional code.

5. The method of claim 1, wherein the multiple Viterbi decoders compensate for a channel response.

6. A high speed Viterbi decoder that comprises:
at least one input buffer that makes an incoming data stream available as a sequence of overlapping data blocks;
a set of decoders that operate in parallel on the overlapping data blocks using add-compare-select operations to obtain a sequence of state metrics representing a most likely path to each of multiple states, wherein each decoder starts decoding based on an end state selection received from a decoder operating on a subsequent data block; and
at least one output buffer that combines outputs of the set of decoders to form a decoded data stream.

7. The Viterbi decoder of claim 6, wherein the set of decoders are convolutional code decoders.

8. The Viterbi decoder of claim 6, wherein the set of decoders are channel response decoders.

9. The Viterbi decoder of claim 6, wherein the at least one input buffer includes two input buffers for each decoder in the set of decoders, and wherein two of the input buffers store incoming data during overlapping portions of the overlapping data blocks.

10. The Viterbi decoder of claim 6, wherein the at least one input buffer comprises a memory have at least twice as many segments as there are decoders in the set of decoders, and
wherein each decoder can access at least three sequential segments, and wherein the memory is at least large enough to hold as many data blocks as there are decoders in the set of decoders.

11. The Viterbi decoder of claim 6, wherein the at least one input buffer, the set of decoder sand the at least one output buffer are integrated on a silicon substrate, and wherein the incoming data stream has a bit rate greater than 3 Gbits/s.

12. A receiver that comprises:
a sensor that provides an analog signal representative of a signal received from a physical medium;
a converter that generates a digital data stream representative of the received signal;
an input buffer that makes the digital data stream available as a sequence of overlapping data blocks;
multiple decoders that operate in parallel on the sequence of overlapping data blocks using add-compare-select operations to obtain a sequence of state metrics representing a most likely path to each of multiple states,
wherein each of the multiple decoders decodes a given data block of the overlapping data blocks dependent upon decoder end state information provided by a decoder of a subsequent data block, and upon path information derived from the sequence of state metrics, and
wherein outputs of the multiple decoders are combined to provide a decoded data stream.

13. The receiver of claim 12, wherein each of the multiple decoders employs a trace-back technique to decode the given data block, and wherein the trace-back technique involves starting from the decoder end state information.

14. The receiver of claim 12, wherein each of the multiple decoders obtains the decoder end state information and the path information via a register-passing technique.

15. The receiver of claim 12, wherein the physical medium comprises an optical fiber.

16. The receiver of claim 12, wherein the physical medium comprises a magnetic disk.

17. The receiver of claim 12, wherein the physical medium comprises an antenna.

18. The receiver of claim 12, wherein the multiple decoders are integrated on a silicon substrate, and wherein the incoming data stream has a bit rate greater than 3 Gbits/s.

* * * * *